(12) United States Patent
Horiuchi et al.

(10) Patent No.: US 8,785,005 B2
(45) Date of Patent: Jul. 22, 2014

(54) ORGANIC LIGHT-EMITTING DEVICE

(75) Inventors: Takayuki Horiuchi, Tokyo (JP); Jun Kamatani, Tokyo (JP); Akihito Saitoh, Gotemba (JP); Kengo Kishino, Tokyo (JP); Hiroyuki Tomono, Numazu (JP)

(73) Assignee: Canon Kabushiki Kaisha, Tokyo (JP)

( * ) Notice: Subject to any disclaimer, the term of this patent is extended or adjusted under 35 U.S.C. 154(b) by 179 days.

(21) Appl. No.: 13/182,287

(22) Filed: Jul. 13, 2011

(65) Prior Publication Data

US 2012/0012827 A1 Jan. 19, 2012

(30) Foreign Application Priority Data

Jul. 15, 2010 (JP) ................................ 2010-160590

(51) Int. Cl.
*H01L 51/54* (2006.01)
*H01L 27/32* (2006.01)
(52) U.S. Cl.
USPC ........... 428/690; 428/917; 313/504; 313/506; 257/40
(58) Field of Classification Search
CPC ........... C09K 11/06; C09K 2211/1011; H01L 51/0056; H01L 51/0058; H01L 51/0085; H01L 51/5048; H05B 33/14
See application file for complete search history.

(56) References Cited

U.S. PATENT DOCUMENTS 6,803,120 B2 * 10/2004 Fukuoka et al. .............. 428/690
2005/0236981 A1 * 10/2005 Cok et al. ..................... 313/504

FOREIGN PATENT DOCUMENTS

| JP | 2007-142171 A | 6/2007 |
| JP | 2008-198769 A | 8/2008 |
| JP | 2009-70983 A | 4/2009 |
| JP | 2009-152529 A | 7/2009 |

OTHER PUBLICATIONS

Computer-generated translation for JP 2009-152529A (publication date: Jul. 2009) (printed as Part 1 and Part 2).*

* cited by examiner

*Primary Examiner* — Dawn Garrett
(74) *Attorney, Agent, or Firm* — Canon U.S.A., Inc., IP Division

(57) ABSTRACT

Provided is an organic light-emitting device that can be driven at low voltage, that produces a light output with high efficiency and high luminance, and that can emit light with high color purity. An organic light-emitting device includes an anode, a cathode, a light-emitting layer disposed between the anode and the cathode, and an organic layer disposed between the anode and the light-emitting layer. The organic layer has a fused polycyclic compound represented by general formula (1):

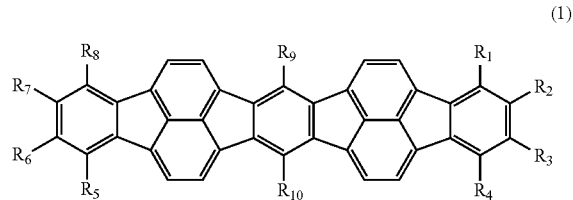

(1)

wherein $R_1$ to $R_8$ are each a hydrogen atom, a halogen atom, a cyano group, a substituted or unsubstituted alkyl group, a substituted or unsubstituted aryl group, or a substituted or unsubstituted polycyclic group and are each the same or different, and wherein $R_9$ and $R_{10}$ are substituted or unsubstituted aryl groups that are the same or different.

12 Claims, 1 Drawing Sheet

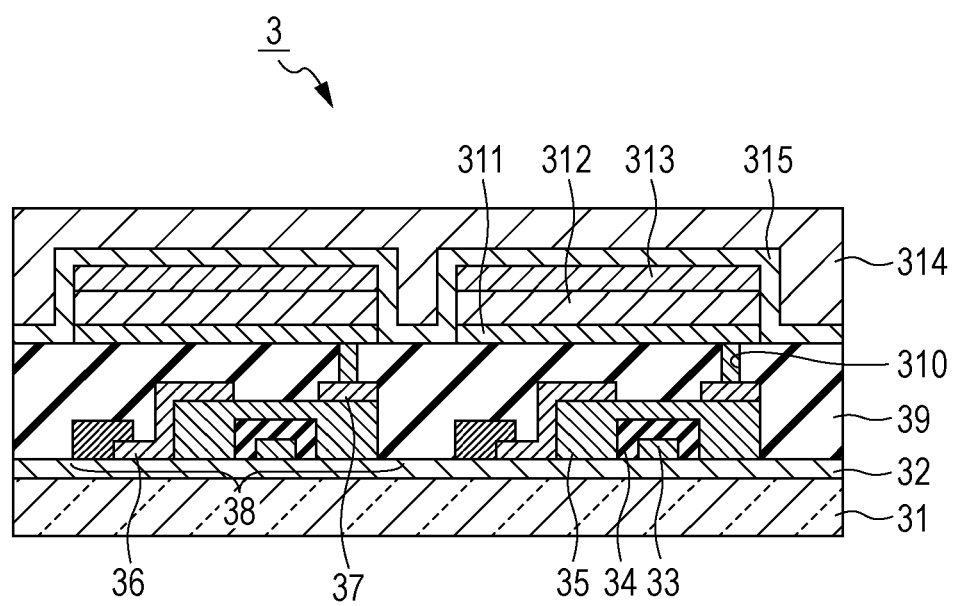

ORGANIC LIGHT-EMITTING DEVICE

BACKGROUND OF THE INVENTION

1. Field of the Invention

The present invention relates to organic light-emitting devices including fused polycyclic compounds.

2. Description of the Related Art

An organic light-emitting device includes an anode, a cathode, and a thin film containing an organic fluorescent compound therebetween. Electrons and holes are injected from the electrodes into the fluorescent compound to generate excitons. As the excitons return to the ground state, the organic light-emitting device emits light.

For applications such as displays for mobile devices, it is necessary that organic light-emitting devices themselves have low power consumption. In particular, intensive research and development has been conducted in hole injection/transport materials used for hole injection layers and hole transport layers, which are peripheral layers for light-emitting layers, because they contribute to the drive voltage, luminous efficiency, and life of the organic light-emitting devices. To date, however, the above problem has yet to be sufficiently addressed.

As one solution to the above problem, Japanese Patent Laid-Open No. 2009-152529 (Patent Document 1) proposes that a fluoranthene derivative be used as a material for hole injection layers in organic light-emitting devices. In addition, Japanese Patent Laid-Open No. 2008-198769 (Patent Document 2) proposes that a charge-generating layer be formed on an anode with a combination of a hole transport material with an aromatic carboxylic acid derivative, which has high electron-accepting ability. Such derivatives, however, need further improvements from viewpoints such as color of light, efficiency, luminance, and durability.

On the other hand, Japanese Patent Laid-Open No. 2009-70983 (Patent Document 3) proposes that a compound having an acenaphthofluoranthene backbone with an aromatic ring fused thereto be used as an organic thin-film transistor (TFT) material.

SUMMARY OF THE INVENTION

Aspects of the present invention provide an organic light-emitting device that has high luminous efficiency and that can be driven at low voltage and an organic light-emitting device that can emit light with high color purity.

That is, an organic light-emitting device is provided according to one aspect that includes an anode, a cathode, a light-emitting layer disposed between the anode and the cathode, and an organic layer disposed between the anode and the light-emitting layer. The organic layer has a fused polycyclic compound represented by general formula (1):

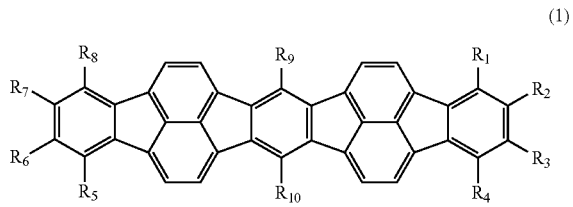

(1)

wherein $R_1$ to $R_8$ are each a hydrogen atom, a halogen atom, a cyano group, a substituted or unsubstituted alkyl group, a substituted or unsubstituted aryl group, or a substituted or unsubstituted polycyclic group and are each the same or different, and wherein $R_9$ and $R_{10}$ are substituted or unsubstituted aryl groups that are the same or different.

According to the above aspect of the present invention, an organic light-emitting device that has high luminous efficiency and that can be driven at low voltage can be provided. Furthermore, an organic light-emitting device that can emit light with high color purity can be provided.

Further features of the present invention will become apparent from the following description of exemplary embodiments with reference to the attached drawing.

BRIEF DESCRIPTION OF THE DRAWING

The FIGURE is a schematic sectional view of organic light-emitting devices and switching devices (TFTs) connected thereto.

DESCRIPTION OF THE EMBODIMENTS

Embodiments of the present invention will now be described in detail. According to one aspect, an organic light-emitting device is provided that includes an anode, a cathode, a light-emitting layer disposed between the anode and the cathode, and an organic layer disposed between the anode and the light-emitting layer. The organic layer has a fused polycyclic compound represented by general formula (1):

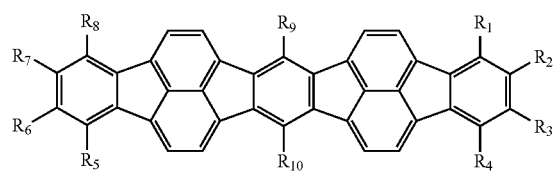

(1)

wherein $R_1$ to $R_8$ are each a hydrogen atom, a halogen atom, a cyano group, a substituted or unsubstituted alkyl group, a substituted or unsubstituted aryl group, or a substituted or unsubstituted polycyclic group and are each the same or different, and wherein $R_9$ and $R_{10}$ are substituted or unsubstituted aryl groups that are the same or different.

That is, the compound represented by general formula (1) has three benzene rings and two naphthalene rings fused alternately with four five-membered rings therebetween. The compound has four linearly arranged five-membered rings and does not have five or more linearly arranged five-membered rings.

Examples of the substituents of the compound of general formula (1) above, namely, $R_1$ to $R_8$, are shown below.

Examples of halogen atoms represented by $R_1$ to $R_8$ in the formula include fluorine, chlorine, bromine, and iodine atoms.

Examples of alkyl groups represented by $R_1$ to $R_8$ include, but not limited to, methyl, ethyl, n-propyl, isopropyl, n-butyl, tert-butyl, sec-butyl, octyl, 1-adamantyl, and 2-adamantyl groups.

Examples of aryl groups represented by $R_1$ to $R_8$ include, but not limited to, phenyl, naphthyl, anthryl, phenanthryl, indenyl, biphenyl, terphenyl, fluorenyl, pyrenyl, acenaphthenyl, fluoranthenyl, benzofluoranthenyl, triphenylenyl, chrysenyl, and perylenyl groups.

Examples of polycyclic groups represented by $R_1$ to $R_{10}$ include, but not limited to, pyridyl, quinolyl, oxazolyl, oxadiazolyl, thiazolyl, thiadiazolyl, carbazolyl, acridinyl, phenanthrolyl, thienyl, pyrimidinyl, bipyridyl, terthienyl, and quinoxalinyl groups.

Examples of substituents that the above substituents, namely, alkyl, aryl, and polycyclic groups, may have include, but not limited to, alkyl groups such as methyl, ethyl, and propyl groups; aralkyl groups such as a benzyl group; aryl groups such as phenyl and biphenyl groups; polycyclic groups such as pyridyl and pyrrolyl groups; amino groups such as dimethylamino, diethylamino, dibenzylamino, diphenylamino, and ditolylamino groups; alkoxy groups such as methoxy, ethoxy, propoxy, and phenoxy groups; cyano groups; and halogen atoms such as fluorine, chlorine, bromine, and iodine atoms.

$R_1$ to $R_8$ may each be the same or different.

Materials used for organic light-emitting devices need to be applicable to sublimation purification as a method for highly purifying the materials and vacuum deposition as a method for forming organic compound layers. In sublimation and vacuum deposition, the materials are exposed to temperatures higher than 300° C. in a high vacuum, namely, about $10^{-3}$ Pa. If the materials have a molecular weight more than 1,000, the materials themselves are exposed to higher temperatures. This may cause thermal decomposition of the materials themselves, and the desired properties may no longer be achieved. Accordingly, the fused polycyclic compound of this embodiment, which is used as a material for organic light-emitting devices, may have a molecular weight of 1,000 or less.

The introduction of an aryl, polycyclic, or alkyl group into the fused polycyclic compound is significantly effective for protecting highly reactive moieties, ensuring deposition stability in the fabrication of organic light-emitting devices, and retarding crystallization in thin film. At the same time, the electron-donating ability of an alkyl group or the electron-withdrawing ability of a halogen atom, a cyano group, or a polycyclic group can be used to adjust the highest occupied molecular orbital (HOMO) level and the lowest unoccupied molecular orbital (LUMO) level.

In particular, a substituted or unsubstituted aryl group can be introduced to the center of the fused polycyclic plane, namely, $R_9$ or $R_{10}$, in general formula (1) above. If an aryl group is introduced to $R_9$ or $R_{10}$, the molecular plane of the aryl group is oriented nearly perpendicularly to the fused polycyclic plane because of the steric hindrance from the adjacent hydrogen atoms. This reduces the interaction between the fused polycyclic rings of the molecules, thus lowering the sublimation temperature. In particular, a substituted or unsubstituted aryl group can be introduced to each of $R_9$ and $R_{10}$. Examples of aryl groups represented by $R_9$ and $R_{10}$ include, but not limited to, phenyl and biphenyl groups.

The characteristics of the fused polycyclic compound of this embodiment represented by general formula (1) above will now be described. First, the energy level will be described, and second, the fluorescence characteristics will be described.

First, the energy level will be described. The fused polycyclic compound represented by general formula (1) above has a large fused polycyclic plane. Accordingly, the fused polycyclic compound is expected to provide high carrier mobility when used as an organic semiconductor material, as discussed in Patent Document 3. However, as a result of intensive research on the energy level of the fused polycyclic compound represented by general formula (1) above, the present inventors have found that the compound is suitable as a material for organic light-emitting devices, particularly, as a hole injection/transport material. This point will now be described in more detail.

First, molecular orbital calculations were performed by the density functional theory at the B3LYP/6-31G* level to estimate the HOMO levels of exemplary compound 1-1, exemplary compound 1-9 (the backbone of the fused polycyclic compound represented by general formula (1) above), and compound 1 (fused polycyclic compound, disclosed in Patent Document 1, having six linearly arranged five-membered rings). In addition, exemplary compound 1-1 was used to form a thin film (spin coating film) by the method described below to measure the energy gap and HOMO and LUMO levels thereof. Table 1 below shows the calculated and measured HOMO levels.

Exemplary compound 1-1, described later, presumably has substantially the same energy level as the backbone of the fused polycyclic compound represented by general formula (1) above.

Evaluation of Energy Level

Exemplary compound 1-1 was mixed with tetrahydrofuran (THF) to prepare a THF solution containing 0.1% by weight of exemplary compound 1-1. This solution was dropped on a glass plate and was subjected to spin coating first at 500 rpm for 10 seconds and then at 1,000 rpm at 40 seconds to form a thin film (spin coating film).

The HOMO level of the compound was determined by measuring the ionization potential of the thin film using AC-2 available from Riken Keiki Co., Ltd. and giving a minus sign to the resultant value. The energy gap was calculated from the absorption spectrum of the thin film measured by V-560 available from JASCO Corporation. Specifically, the energy gap was calculated by drawing a tangent at an absorption edge of the absorption spectrum on the long-wavelength side and finding the energy at the wavelength where the tangent intersects the wavelength axis. In addition, the LUMO level was determined by adding the energy gap to the HOMO level.

TABLE 1

| Structure | Calculated HOMO level | Measured HOMO level |
|---|---|---|
| Exemplary compound 1-1 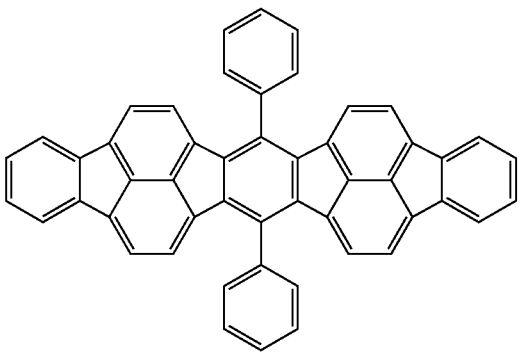 | −5.14 | −5.70 |

TABLE 1-continued

| | Structure | Calculated HOMO level | Measured HOMO level |
|---|---|---|---|
| Exemplary compound 1-9 | | −5.21 | / |
| Compound 1 | | −5.06 | / |

As the results of the calculations, the difference in HOMO level between exemplary compound 1-1 and exemplary compound 1-9 was 0.07 eV, and the difference in HOMO level between exemplary compound 1-9 and compound 1 was 0.15 eV. Thus, the calculated HOMO levels of the three compounds were nearly equivalent. On the other hand, the measured HOMO level of exemplary compound 1-1 was −5.70 eV. This suggests that the fused polycyclic compound represented by general formula (1) above is suitable for hole injection and transport from an anode having a work function of 5 to 6 eV, such as one formed of indium tin oxide (ITO). When used as a hole injection layer, particularly, the compound provides superior hole injection properties since the hole injection layer has a larger contact area with the anode because of the planar molecular geometry of the compound.

However, even if the number of five-membered rings is increased to more than four, as in compound 1, the HOMO level increases little; rather, the solubility and sublimability decrease significantly because of the increased molecular interaction. If the compound is poorly soluble in organic solvents, it cannot be purified by recrystallization or column chromatography and may therefore contain impurities. In addition, if the sublimability is low, the compound needs to be heated at elevated temperatures during sublimation purification and vacuum deposition and may therefore be thermally decomposed. In either case, the material may contain impurities that degrade device characteristics such as efficiency and life. Furthermore, it may be difficult to form a stable amorphous thin film because the increased molecular planarity increases the crystallinity. This may result in a short in devices or a shortened life.

Of these, the sublimability will be more specifically discussed. Exemplary compound 1-1 needs to be heated at 400° C. during sublimation purification, although it is not decomposed. Compound 1 is more likely to be thermally decomposed during sublimation because it needs to be heated above 400° C., as estimated from the molecular weight and planarity thereof. Thus, the fused polycyclic compound represented by general formula (1) above, which has four linearly arranged five-membered rings, can be used.

The LUMO level of exemplary compound 1-1 is low, namely, −3.66 eV (the energy gap is 2.04 eV (608 nm)). This characteristic of the fused polycyclic compound represented by general formula (1) above is attributed to the high electron-accepting ability and small energy gap derived from the five-membered ring structure. As disclosed in Patent Document 2, a donor and acceptor that have a difference between HOMO (donor) and LUMO (acceptor) levels of 2 eV or less can be used as a charge-generating layer in an organic light-emitting device because electrons travel between the two types of material. Thus, the fused polycyclic compound represented by general formula (1) above can also be used as a charge-generating layer in combination with a compound having a HOMO level of about −5 eV, such as a triarylamine. If a charge-generating layer is formed on the anode or in the hole transport layer, the charge-generating layer emits holes efficiently, thus providing a significant voltage-lowering effect. That is, the charge-generating layer provides high luminous efficiency so that the device can be driven at low voltage to emit light with the required intensity.

Second, the fluorescence characteristics will be described. When the thin film of exemplary compound 1-1 formed for the evaluation of energy level was excited at an excitation wavelength of 450 nm using F-4500 available from Hitachi, Ltd., only a weak emission spectrum having its peak strength at 700 nm was observed. This means that the fused polycyclic compound represented by general formula (1) above is nonfluorescent in the visible region. This property provides the superior characteristic of not degrading the color purity of light emitted from a light-emitting layer in an organic light-emitting device.

In organic light-emitting devices, the color purity of light is often degraded by light emitted from the peripheral layers as carriers leak from the light-emitting layer or excitons are diffused, which causes a problem, particularly for application to displays. Patent Document 1 discloses a technique for improving adhesion to the anode using a fluoranthene derivative as an interface-improving layer to improve the life, although typical fluoranthene derivatives are known to be highly fluorescent. For example, fluoranthene has a fluorescence quantum yield of 0.35, and benzo[k]fluoranthene has a fluorescence quantum yield of 1.0 (see Steaven L. Murov, Ian Carmichael, Gordon L. Hug, "Handbook of Photochemistry"). Thus, it is undesirable to use a fluoranthene derivative in view of achieving high color purity because it may cause unwanted emission of light, for example, as carriers leak.

In contrast, the fused polycyclic compound represented by general formula (1) above is nonfluorescent despite partially having a fluoranthene structure. This is because the excited singlet state (fluorescent) of the compound has a lower energy than those of compounds that emit light in the visible region and therefore transitions more easily to a high vibrational energy level of the ground state (nonfluorescent) through internal conversion. Thus, the fused polycyclic compound represented by general formula (1) above is particularly suitable as a material for the peripheral layers for the light-emitting layer.
Examples of compounds represented by general formula (1) above for use in this embodiment include, but not limited to, the following compounds:
1-1
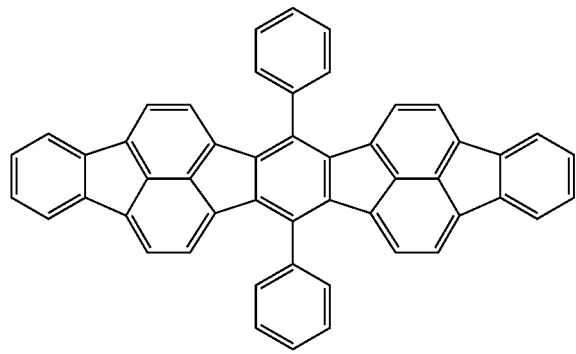
1-2
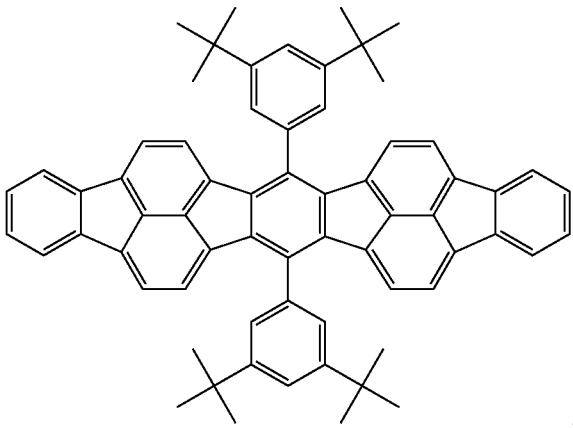
1-3
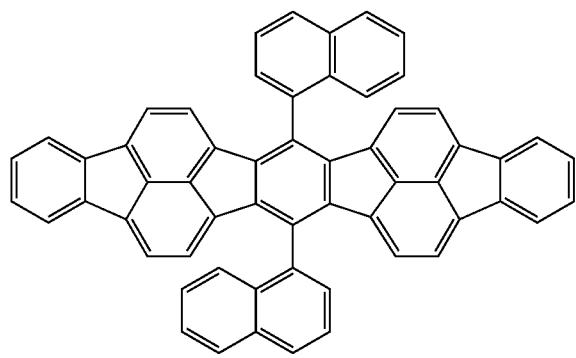
1-4
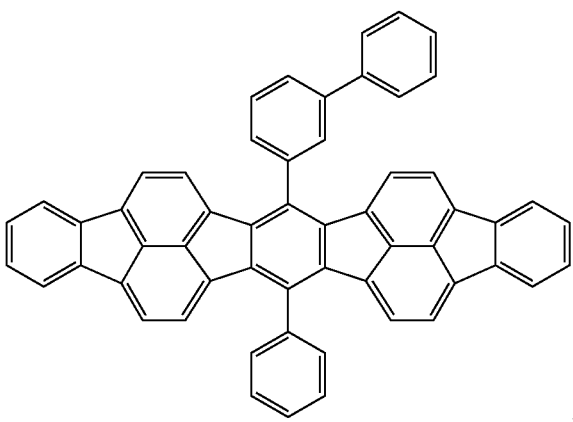
1-5
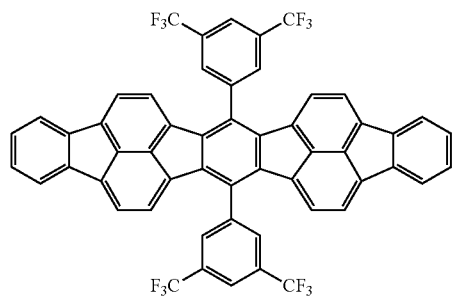
1-6
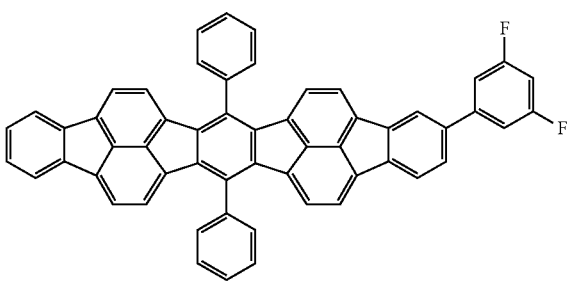
1-7
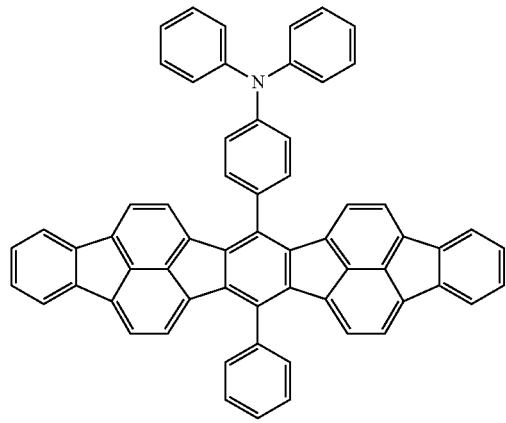
1-8
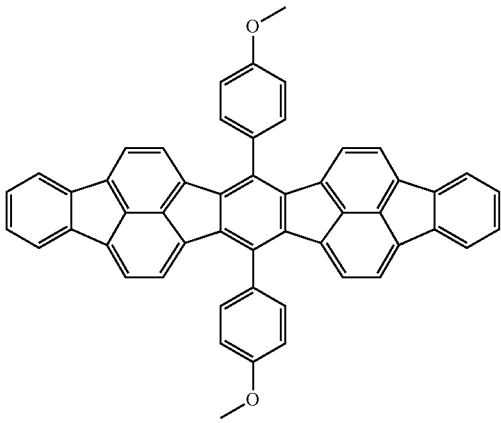

-continued
1-9
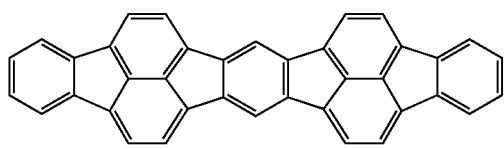
1-10
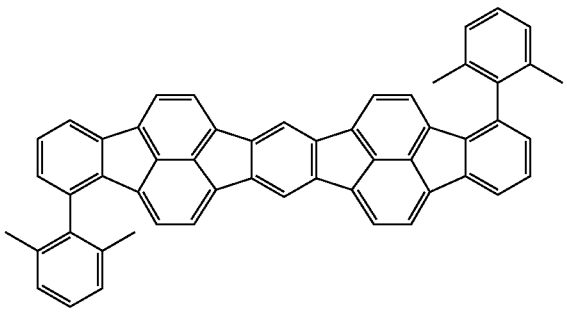
1-11
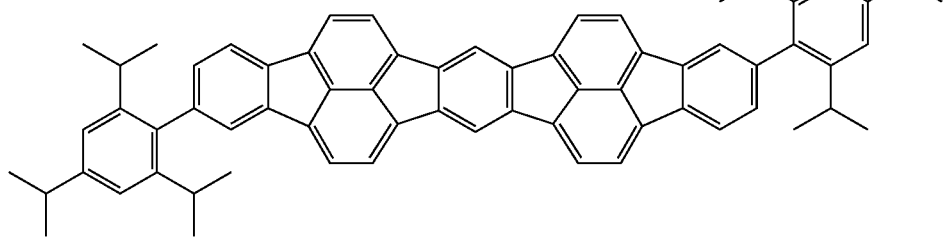
2-1
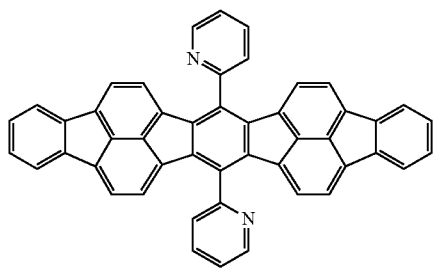
2-2
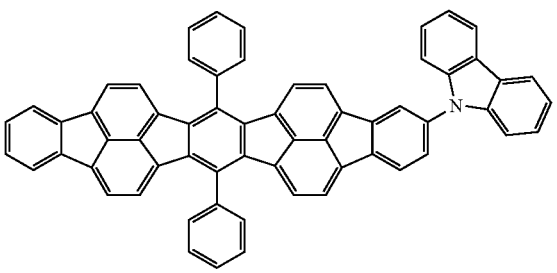
3-1
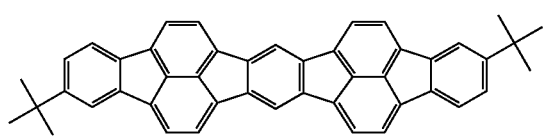
3-2
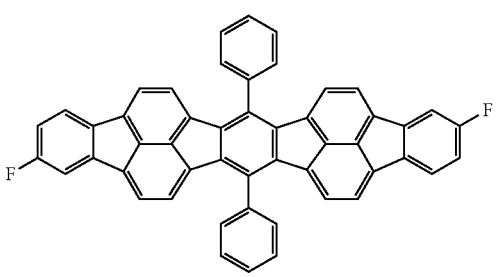
3-3
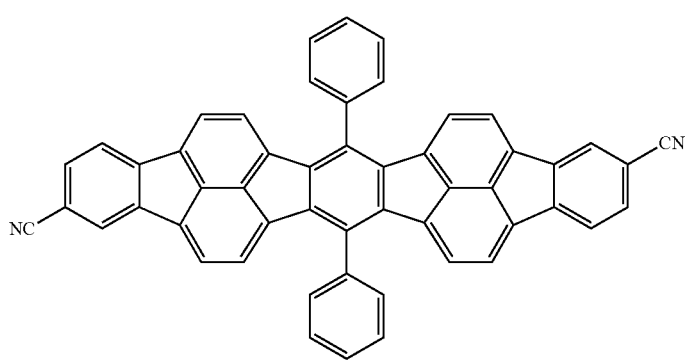

Synthesis of Organic Compound

As described in detail in Example 1 later, the organic compound according to this embodiment can be synthesized, for example, by the following synthesis route:

First Step

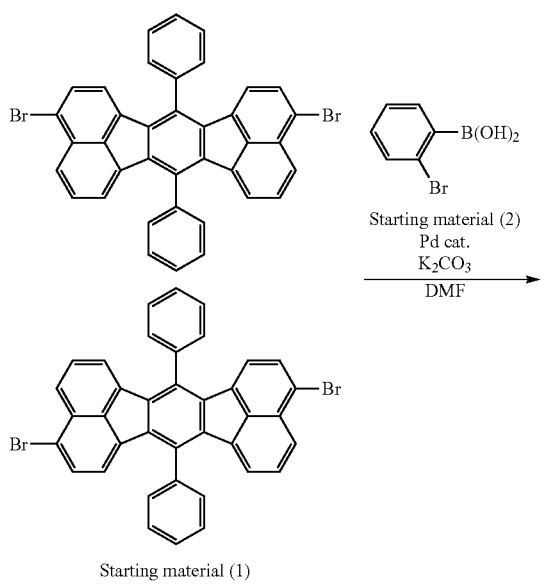

Starting material (1)

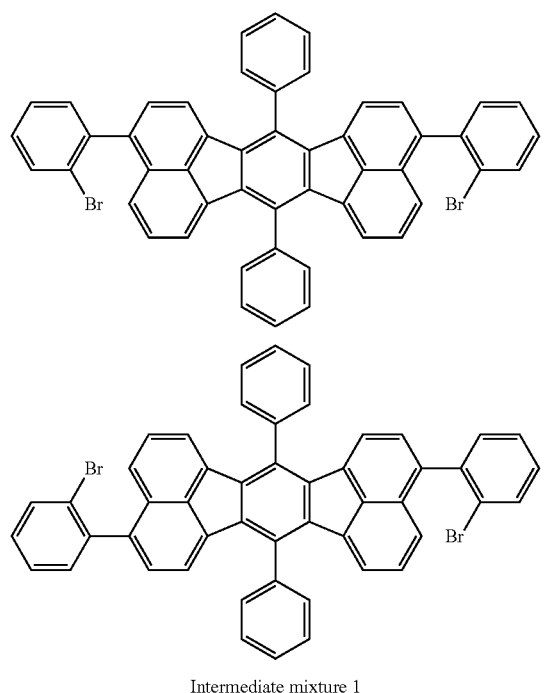

Intermediate mixture 1

Second Step

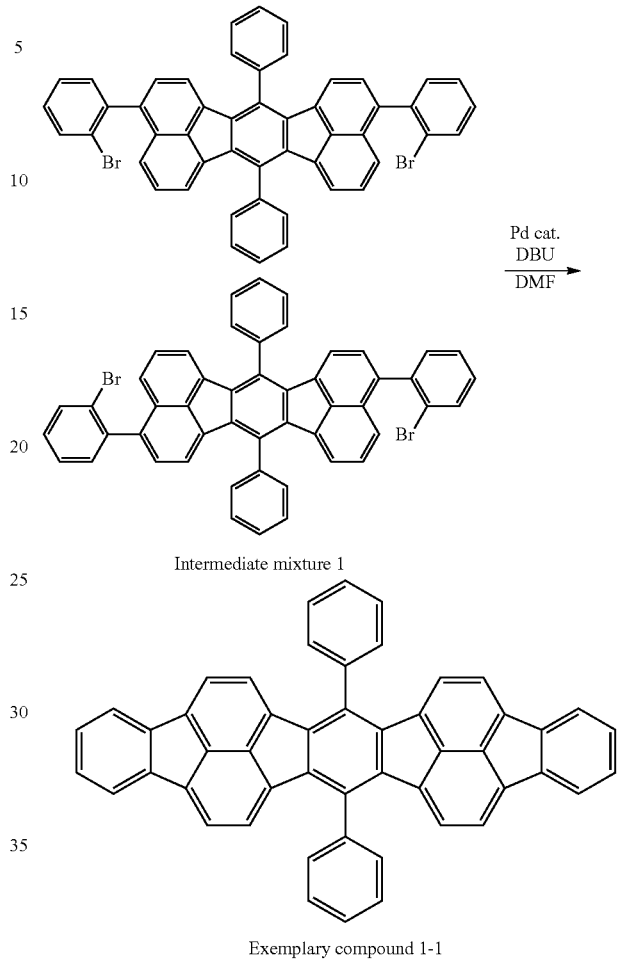

Intermediate mixture 1

Exemplary compound 1-1

Specifically, as the first step, according to a synthesis method disclosed in Japanese Patent Laid-Open No. 2007-142171, starting material (1) (dibromodiphenylacenaphthofluoranthene isomer mixture) and starting material (2) (1-bromophenylboronic acid) are reacted to synthesize intermediate mixture 1.

As the second step, intermediate mixture 1 can be subjected to intramolecular Heck cyclization reaction in the presence of a catalyst to synthesize the target compound, namely, exemplary compound 1-1.

Starting materials (1) and (2) in the first step can be changed to synthesize the fused polycyclic compounds of this embodiment as shown above.

Description of Organic Light-Emitting Device

Next, an organic light-emitting device according to an embodiment of the present invention will be described.

In the organic light-emitting device according to this embodiment, an organic layer disposed between an anode and a light-emitting layer contains a fused polycyclic compound having four linearly arranged five-membered rings and represented by general formula (1) above.

That is, the organic light-emitting device according to this embodiment includes an anode, a cathode, and organic compound layers disposed therebetween. One of the anode and the cathode may be transparent or semitransparent (transmittance of about 50%) to the color of the light emitted. In particular, the organic light-emitting device according to this embodiment includes a hole injection layer or hole transport layer containing a fused polycyclic compound represented by general formula (1) above between the anode and the light-emitting layer.

In this embodiment, the hole injection or transport layer may be formed only of the fused polycyclic compound represented by general formula (1) above or may be formed of the fused polycyclic compound represented by general formula (1) above and another hole injection/transport material.

The layer structure and materials of the organic light-emitting device according to this embodiment are appropriately selected taking into account the balance against the carrier mobility of the electron injection/transport material and the differences in HOMO and LUMO levels between the host contained in the light-emitting layer and the materials of the adjacent layers so that the organic light-emitting device has the most advantageous characteristics.

Examples of the structure of the organic light-emitting device according to this embodiment include the following structures:

(1) Anode/light-emitting layer/cathode;
(2) Anode/hole transport layer/electron transport layer/cathode;
(3) Anode/hole transport layer/light-emitting layer/electron transport layer/cathode;
(4) Anode/hole injection layer/hole transport layer/light-emitting layer/electron transport layer/cathode;
(5) Anode/hole injection layer/hole transport layer/light-emitting layer/electron transport layer/electron injection layer/cathode; and
(6) Anode/hole injection layer/hole transport layer/light-emitting layer/hole-exciton blocking layer/electron transport layer/electron injection layer/cathode;

where the slashes indicate that the layers on both sides are adjacent to each other. The examples shown above are merely basic device structures, and the present invention is not limited thereto.

In addition to structures (1) to (6) above, various layer structures can be used, including one having an insulating layer, adhesive layer, or interference layer between the electrodes and the organic compound layers and one having an electron transport layer or hole transport layer including two layers with different ionization potentials.

In the organic light-emitting device according to this embodiment, the fused polycyclic compound represented by general formula (1) above can be optionally used in combination with known compounds. Specifically, the following compounds can be used:

(a) low-molecular-weight or polymer hole injection compound or hole transport compound:
(b) host compound serving as the host of the light-emitting layer;
(c) luminescent compound serving as the guest of the light-emitting layer; and
(d) electron injection compound or electron transport compound.

Examples of these compounds will now be described.

The hole injection compound or hole transport compound can be a material with high hole mobility. Examples of low-molecular-weight and polymer materials with hole injection properties or hole transport properties include, but not limited to, triarylamines, phenylenediamines, stilbenes, phthalocyanines, porphyrins, polyvinylcarbazole, polythiophene, and other conductive polymers.

Examples of the host of the light-emitting layer include the compounds shown in Table 2 below.

TABLE 2

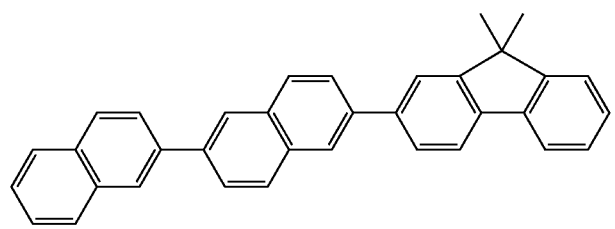 [SMILES: CC1(C)c2ccccc2-c2ccc(-c3ccc4cc(-c5ccc6ccccc6c5)ccc4c3)cc21]

H1

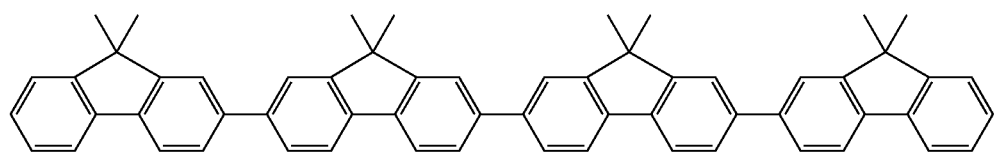 [SMILES: CC1(C)c2ccccc2-c2ccc(-c3ccc4c(c3)C(C)(C)c3cc(-c5ccc6c(c5)C(C)(C)c5cc(-c7ccc8c(c7)C(C)(C)c7ccccc7-8)ccc5-6)ccc3-4)cc21]

H2

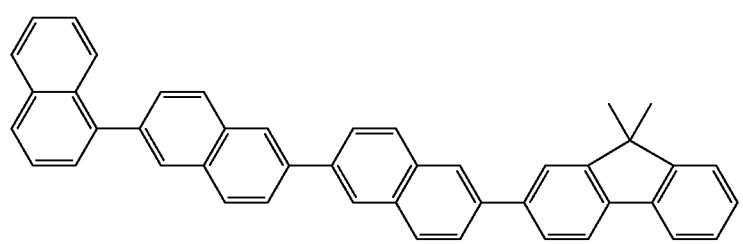 [SMILES: CC1(C)c2ccccc2-c2ccc(-c3ccc4cc(-c5ccc6cc(-c7cccc8ccccc78)ccc6c5)ccc4c3)cc21]

H3

TABLE 2-continued
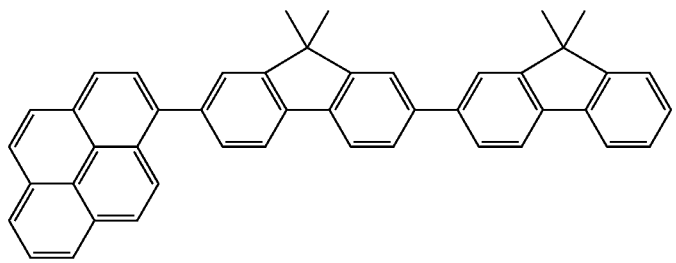 [SMILES: CC1(C)c2ccccc2-c2ccc(-c3ccc4c(c3)C(C)(C)c3cc(-c5ccc6ccc7cccc8ccc5c6c78)ccc3-4)cc21]
H4
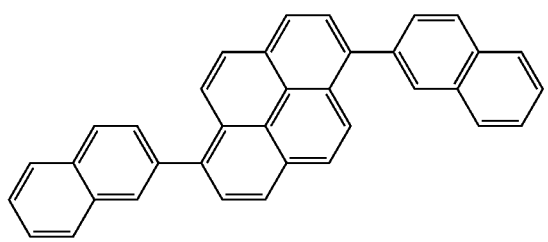 [SMILES: c1ccc2cc(-c3ccc4ccc5c(-c6ccc7ccccc7c6)ccc6ccc3c4c65)ccc2c1]
H5
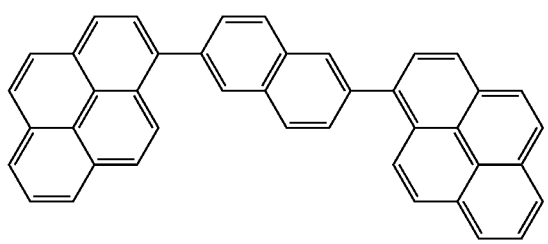 [SMILES: c1cc2ccc3ccc(-c4ccc5cc(-c6ccc7ccc8cccc9ccc6c7c89)ccc5c4)c4ccc(c1)c2c34]
H6
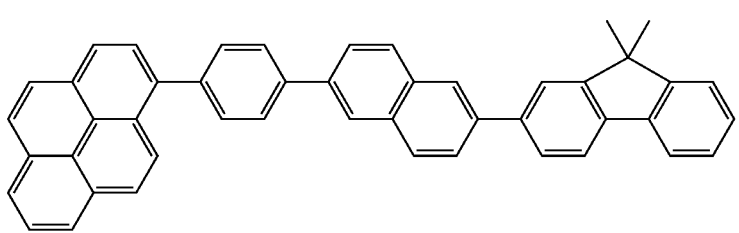 [SMILES: CC1(C)c2ccccc2-c2ccc(-c3ccc4cc(-c5ccc(-c6ccc7ccc8cccc9ccc6c7c89)cc5)ccc4c3)cc21]
H7
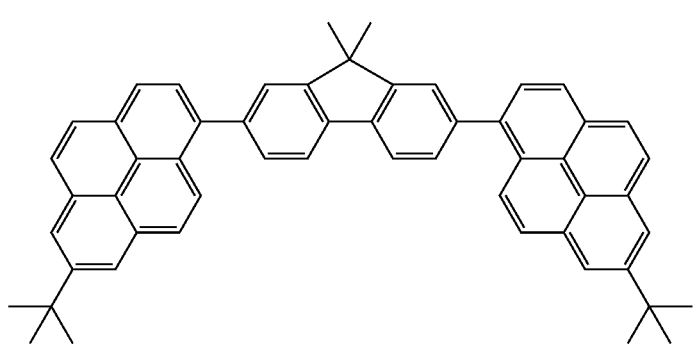 [SMILES: CC(C)(C)c1cc2ccc3ccc(-c4ccc5c(c4)C(C)(C)c4cc(-c6ccc7ccc8cc(C(C)(C)C)cc9ccc6c7c89)ccc4-5)c4ccc(c1)c2c34]
H8

TABLE 2-continued
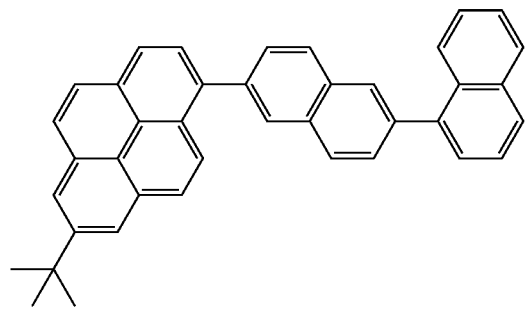 [SMILES: CC(C)(C)c1cc2ccc3ccc(-c4ccc5cc(-c6cccc7ccccc67)ccc5c4)c4ccc(c1)c2c34]
H9
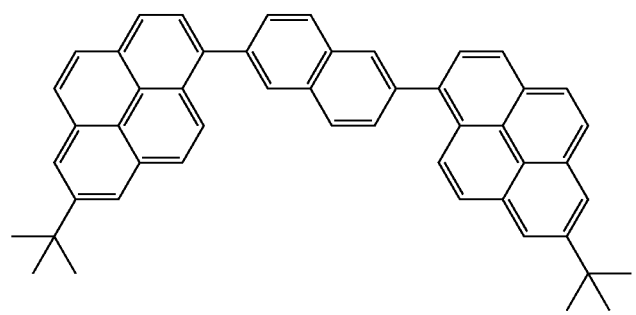 [SMILES: CC(C)(C)c1cc2ccc3ccc(-c4ccc5cc(-c6ccc7ccc8cc(C(C)(C)C)cc9ccc6c7c89)ccc5c4)c4ccc(c1)c2c34]
H10
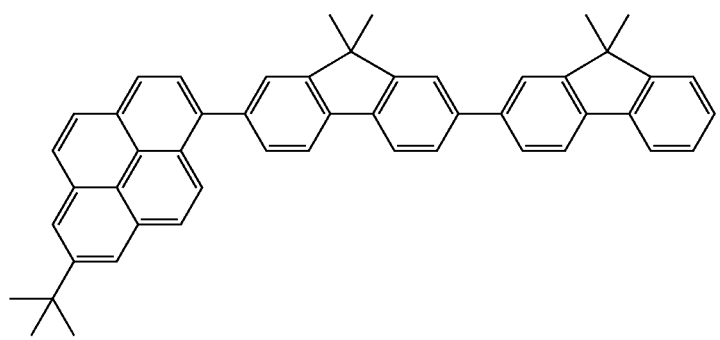 [SMILES: CC(C)(C)c1cc2ccc3ccc(-c4ccc5c(c4)C(C)(C)c4cc(-c6ccc7c(c6)C(C)(C)c6ccccc6-7)ccc4-5)c4ccc(c1)c2c34]
H11
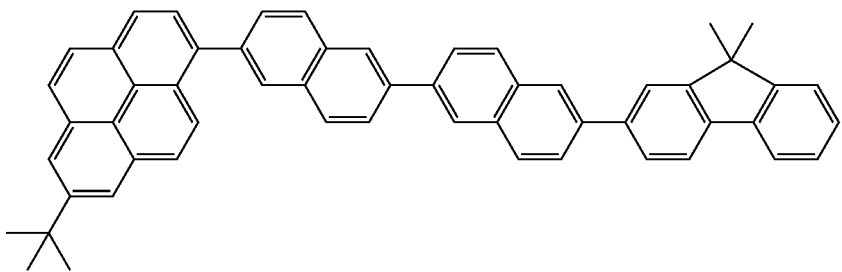 [SMILES: CC(C)(C)c1cc2ccc3ccc(-c4ccc5cc(-c6ccc7cc(-c8ccc9c(c8)C(C)(C)c8ccccc8-9)ccc7c6)ccc5c4)c4ccc(c1)c2c34]
H12
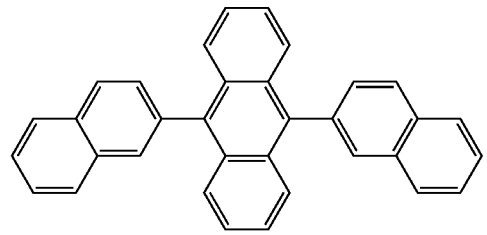 [SMILES: c1ccc2cc(-c3c4ccccc4c(-c4ccc5ccccc5c4)c4ccccc34)ccc2c1]
H13

TABLE 2-continued
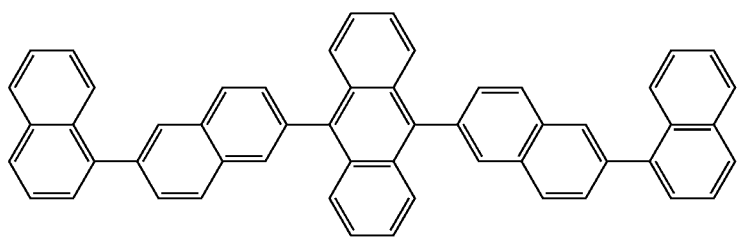 [SMILES: c1ccc2c(-c3ccc4cc(-c5c6ccccc6c(-c6ccc7cc(-c8cccc9ccccc89)ccc7c6)c6ccccc56)ccc4c3)cccc2c1]
H14
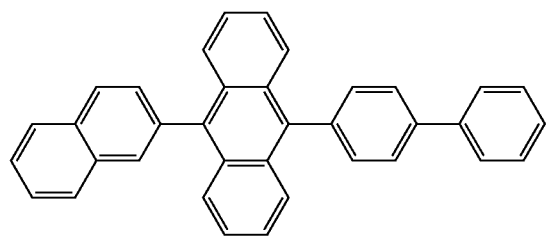 [SMILES: c1ccc(-c2ccc(-c3c4ccccc4c(-c4ccc5ccccc5c4)c4ccccc34)cc2)cc1]
H15
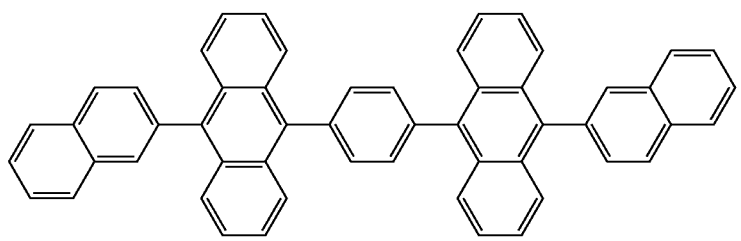 [SMILES: c1ccc2cc(-c3c4ccccc4c(-c4ccc(-c5c6ccccc6c(-c6ccc7ccccc7c6)c6ccccc56)cc4)c4ccccc34)ccc2c1]
H16
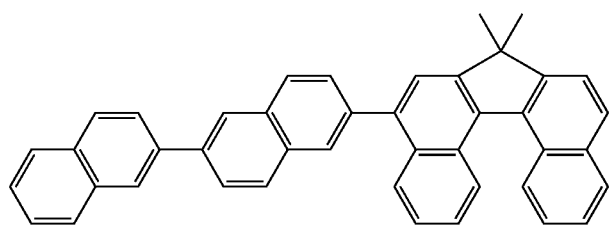 [SMILES: CC1(C)c2ccc3ccccc3c2-c2c1cc(-c1ccc3cc(-c4ccc5ccccc5c4)ccc3c1)c1ccccc21]
H17
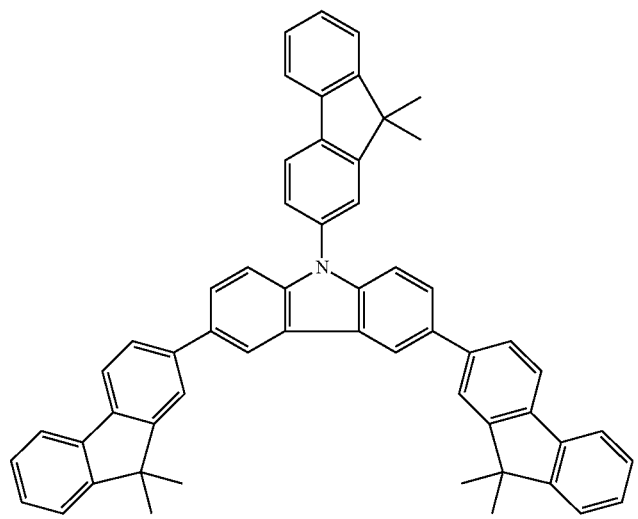 [SMILES: CC1(C)c2ccccc2-c2ccc(-c3ccc4c(c3)c3cc(-c5ccc6c(c5)C(C)(C)c5ccccc5-6)ccc3n4-c3ccc4c(c3)C(C)(C)c3ccccc3-4)cc21]
H18

TABLE 2-continued
| | |
|---|---|
| 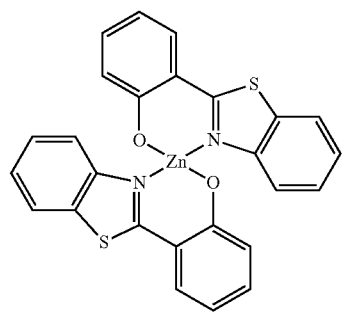 | H19 |
| 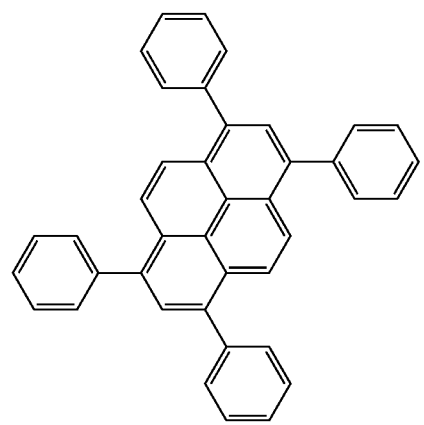 [SMILES: c1ccc(-c2cc(-c3ccccc3)c3ccc4c(-c5ccccc5)cc(-c5ccccc5)c5ccc2c3c54)cc1] | H20 |
| 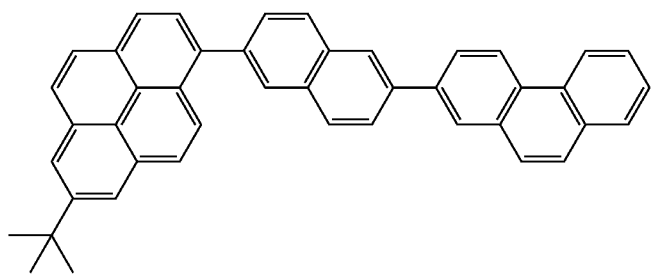 [SMILES: CC(C)(C)c1cc2ccc3ccc(-c4ccc5cc(-c6ccc7c(ccc8ccccc87)c6)ccc5c4)c4ccc(c1)c2c34] | H21 |
| 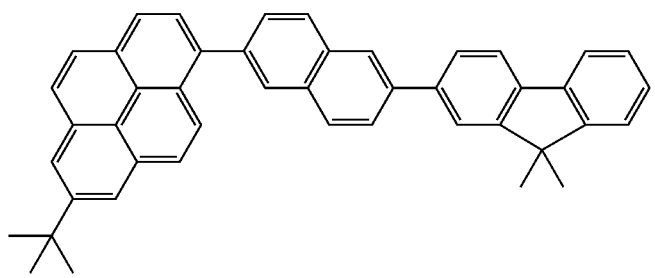 [SMILES: CC(C)(C)c1cc2ccc3ccc(-c4ccc5cc(-c6ccc7c(c6)C(C)(C)c6ccccc6-7)ccc5c4)c4ccc(c1)c2c34] | H22 |
| 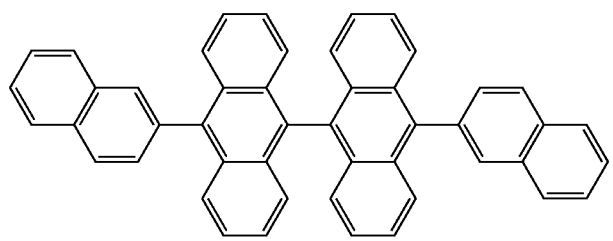 [SMILES: c1ccc2cc(-c3c4ccccc4c(-c4c5ccccc5c(-c5ccc6ccccc6c5)c5ccccc45)c4ccccc34)ccc2c1] | H23 |

TABLE 2-continued

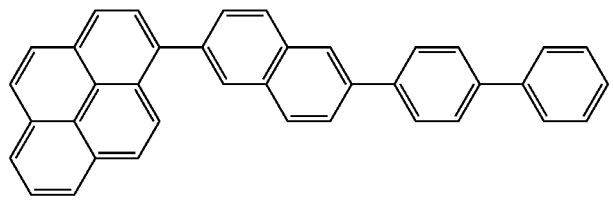 [SMILES: c1ccc(-c2ccc(-c3ccc4cc(-c5ccc6ccc7cccc8ccc5c6c78)ccc4c3)cc2)cc1]
H24

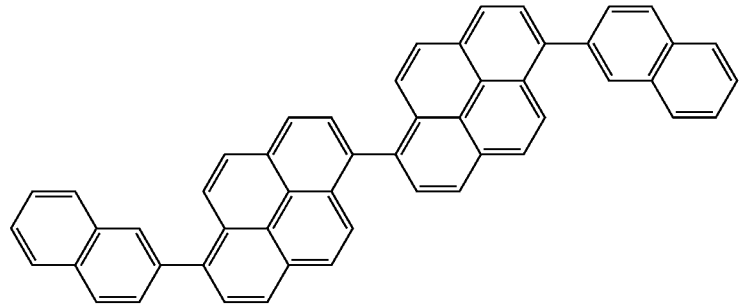 [SMILES: c1ccc2cc(-c3ccc4ccc5c(-c6ccc7ccc8c(-c9ccc%10ccccc%10c9)ccc9ccc6c7c98)ccc6ccc3c4c65)ccc2c1]
H25

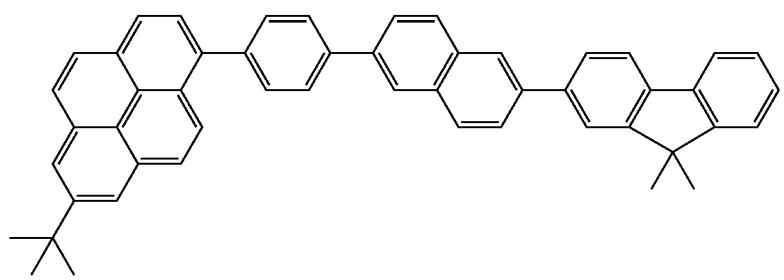 [SMILES: CC(C)(C)c1cc2ccc3ccc(-c4ccc(-c5ccc6cc(-c7ccc8c(c7)C(C)(C)c7ccccc7-8)ccc6c5)cc4)c4ccc(c1)c2c34]
H26

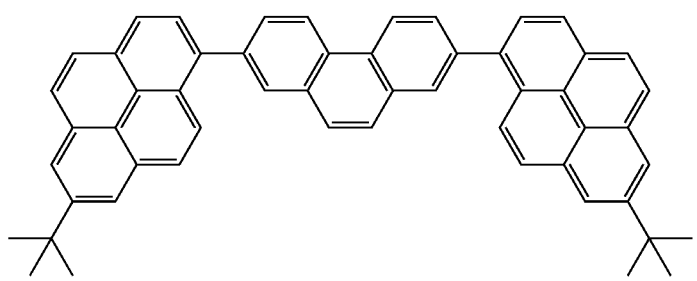 [SMILES: CC(C)(C)c1cc2ccc3ccc(-c4ccc5c(ccc6cc(-c7ccc8ccc9cc(C(C)(C)C)cc%10ccc7c8c9%10)ccc65)c4)c4ccc(c1)c2c34]
H27

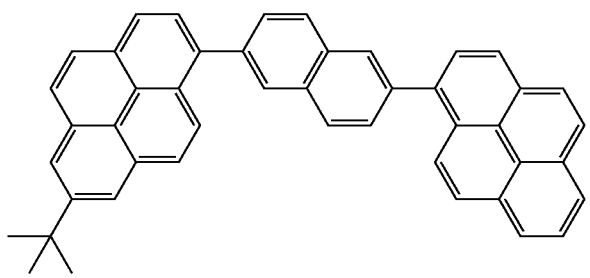 [SMILES: CC(C)(C)c1cc2ccc3ccc(-c4ccc5cc(-c6ccc7ccc8cccc9ccc6c7c89)ccc5c4)c4ccc(c1)c2c34]
H28

Examples other than those shown in Table 2 above include, but not limited to, fused ring compounds (such as fluorenes, naphthalenes, anthracenes, pyrenes, carbazoles, quinoxalines, and quinolines), organoaluminum complexes such as tris(8-quinolinolato)aluminum, organozinc complexes, triphenylamines, and polymers such as polyfluorenes and polyphenylenes.

Examples of the guest of the light-emitting layer include, but not limited to, fused-ring aromatic compounds (such as naphthalenes, phenanthrenes, fluorenes, pyrenes, fluoranthenes, benzofluoranthenes, tetracenes, coronenes, chrysenes, perylenes, 9,10-diphenylanthracenes, and rubrene), quinacridones, acridones, coumarins, pyrans, Nile red, pyrazines, benzoimidazoles, stilbenes, organometallic complexes (such as organoaluminum complexes (e.g., tris(8-quinolinolato)aluminum) and organoberyllium complexes), and polymers such as polyfluorenes and polyphenylenes.

The electron injection compound or electron transport compound used is appropriately selected taking into account, for example, the balance against the hole mobility of the hole injection compound or hole transport compound. Examples of compounds with electron injection properties or electron transport properties include, but not limited to, oxadiazoles, oxazoles, pyrazines, triazoles, triazines, quinolines, quinoxalines, phenanthrolines, and organoaluminum complexes.

The anode can be formed of a material having a high work function. Examples of such materials include metals such as gold, platinum, silver, copper, nickel, palladium, cobalt, selenium, vanadium, and tungsten; alloys thereof; and metal oxides such as tin oxide, zinc oxide, indium oxide, ITO, and indium zinc oxide. Conductive polymers such as polyaniline, polypyrrole, and polythiophene can also be used. These electrode materials can be used alone or in combination. The anode can be composed of either a single layer or a plurality of layers.

On the other hand, the cathode can be formed of a material having a low work function. Examples of such materials include alkali metals such as lithium; alkaline earth metals such as calcium; and metals such as aluminum, titanium, manganese, silver, lead, and chromium. Alloys of these metals can also be used, including magnesium-silver, aluminum-lithium, and aluminum-magnesium. In addition, metal oxides such as ITO can be used. These electrode materials can be used alone or in combination. The cathode can be composed of either a single layer or a plurality of layers.

In the organic light-emitting device according to this embodiment, the layer containing the fused polycyclic compound represented by general formula (1) above and the other organic compound layers are typically formed by vacuum deposition, ion-assisted deposition, sputtering, plasma-assisted deposition, or a known coating process for forming a thin film using an appropriate solvent (such as spin coating, dipping, casting, the Langmuir-Blodgett (LB) technique, or inkjet coating). If the layers are formed by vacuum deposition or solution coating, they have superior stability over time because, for example, crystallization does not tend to occur. If the layers are formed by coating, films can be formed in combination with an appropriate binder resin.

Examples of binder resins include, but not limited to, polyvinylcarbazole resins, polycarbonate resins, polyester resins, acrylonitrile-butadiene-styrene (ABS) resins, acrylic resins, polyimide resins, phenolic resins, epoxy resins, silicone resins, and urea resins. These binder resins can be used alone as a homopolymer or copolymer or can be used as a mixture of two or more. In addition, known additives such as a plasticizer, antioxidant, and ultraviolet absorber can be optionally used in combination.

Examples of substrates on which the organic light-emitting device according to this embodiment is formed include, but not limited to, nontransparent substrates such as metal substrates and ceramic substrates and transparent substrates such as glass substrates, quartz substrates, and plastic sheets. Alternatively, for example, a color filter film, a fluorescence color conversion filter film, or a dielectric reflective film can be used as the substrate to control the color of light.

In addition, the organic light-emitting device may have a protective layer or a sealing layer to avoid contact with, for example, oxygen and moisture.

Examples of protective layers include inorganic material films such as diamond thin films, metal oxide films, and metal nitride films; polymer films such as fluoropolymer films, polyethylene films, silicone films, and polystyrene films; and photocurable resin films. Alternatively, the device itself can be covered with, for example, glass, gas impermeable film, or metal and be packaged with an appropriate sealing resin.

The organic light-emitting device according to this embodiment can be applied to products requiring high energy efficiency and high luminance. Examples of applications include image displays (flat panel displays), lighting devices, light sources of printers, and backlights of liquid crystal displays.

The FIGURE is a schematic diagram showing an example of the sectional structure of TFTs, organic light-emitting devices, and a substrate in an image display 3. A substrate 31 such as a glass substrate has a moisture-proofing film 32 for protecting the members to be formed thereabove (TFTs and organic layers). The moisture-proofing film 32 is formed of, for example, silicon oxide or a composite of silicon oxide and silicon nitride. Gate electrodes 33 are disposed on the moisture-proofing film 32. The gate electrodes 33 are formed by depositing a metal such as chromium by sputtering.

Gate insulators 34 are disposed so as to cover the gate electrodes 33. The gate insulators 34 are formed by depositing, for example, silicon oxide by a process such as plasma-enhanced CVD or catalytic CVD (cat-CVD) and then patterning the film.

Semiconductor layers 35 are disposed so as to cover the gate insulators 34. The semiconductor layers 35 are formed by depositing a silicon film by a process such as plasma-enhanced CVD (and annealing the film at 290° C. or more if necessary) and then patterning the film on the basis of the circuit pattern.

TFTs 38 include the gate electrodes 33, the gate insulators 34, the semiconductor layers 35, and drain electrodes 36 and source electrodes 37 disposed on the semiconductor layers 35 so as to be separated from each other. In the FIGURE, the two TFTs 38 are disposed in the same plane. An insulating film 39 is disposed so as to cover the TFTs 38. Contact holes (through-holes) 310 filled with a metal are located such that the source electrodes 37 of the TFTs 38 are connected to anodes 311 for organic light-emitting devices.

Multilayer or single-layer organic layers 312 and cathodes 313 are sequentially stacked on the anodes 311. These components constitute organic light-emitting devices.

That is, the image display 3 includes a plurality of pixels having organic light-emitting devices and the TFTs 38, which serve as units configured to supply an electrical signal to the organic light-emitting devices.

As shown, a first protective layer 314 and a second protective layer 315 may be disposed to prevent deterioration of the organic light-emitting devices.

The switching devices used for the image display 3 can be of any type. For example, single-crystal silicon substrates, metal-insulator-metal (MIM) devices, or amorphous silicon (a-Si) devices can be easily applied.

An organic light-emitting display panel can be produced by sequentially stacking multilayer or single-layer organic light-emitting layers and cathode layers on ITO electrodes. A display panel using an organic compound according to an embodiment of the present invention can be driven to provide a stable display with excellent image quality over an extended period of time.

In addition, either a bottom-emission structure (which outputs light from the substrate side) or a top-emission structure (which outputs light from the side opposite the substrate) can be used as the direction in which the devices output light.

EXAMPLES

Examples will now be described, although the present invention is not limited thereto.

Example 1

Synthesis of Exemplary Compound 1-1

(1) Synthesis of Intermediate Mixture 1

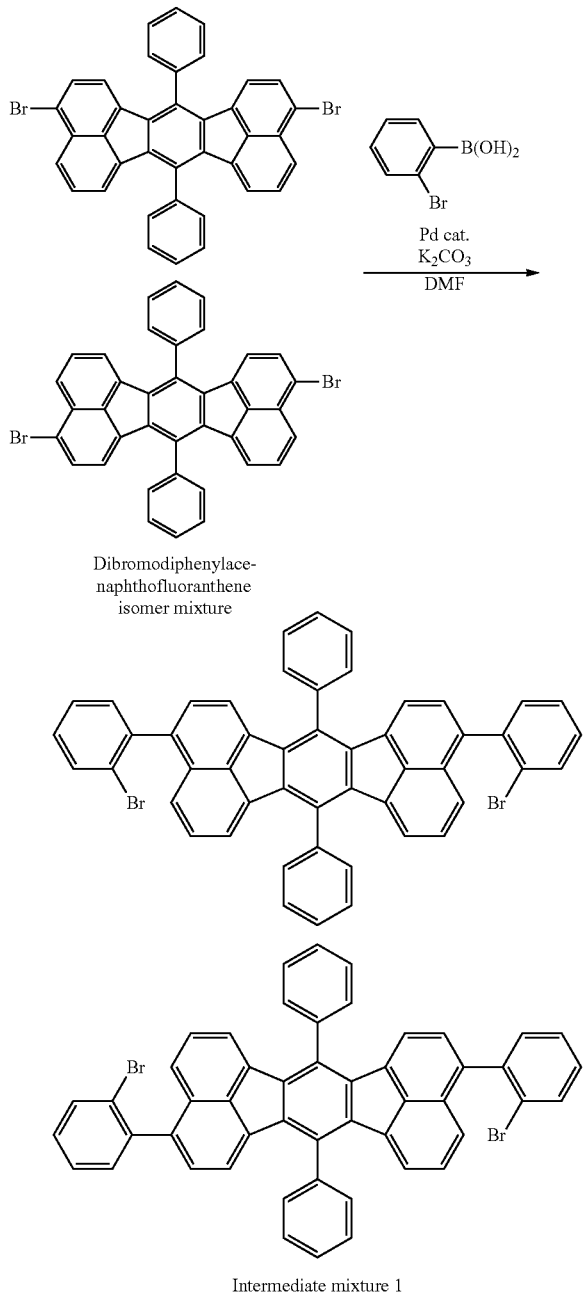

Intermediate mixture 1

Exemplary compound 1-1 was synthesized by the method described below. Intermediate mixture 1 was synthesized by the method disclosed in Japanese Patent Laid-Open No. 2007-142171.

First, the following compounds were fed into a reaction vessel in a nitrogen atmosphere:
(1) Dibromodiphenylacenaphthofluoranthene isomer mixture: 0.428 g (0.673 mmol)
(2) 2-Bromophenylboronic acid: 0.324 g (1.61 mmol)
(3) $Pd(PPh_3)_4$: 0.233 g (0.202 mmol)
(4) Potassium carbonate: 1.86 g (13.5 mmol)
(5) N,N-dimethylformamide (DMF) (5 mL)

This reaction solution was stirred for one hour while being heated in a silicone oil bath heated to 100° C. The reaction solution was then cooled to room temperature, and water and methanol were added to precipitate a solid crude product. The crude product was then filtered, was washed with methanol, and was purified by silica gel column chromatography (developing solvent: chloroform/heptane, 1:3) to yield 0.385 g (yield: 73%) of intermediate mixture 1.

(2) Synthesis of Exemplary Compound 1-1

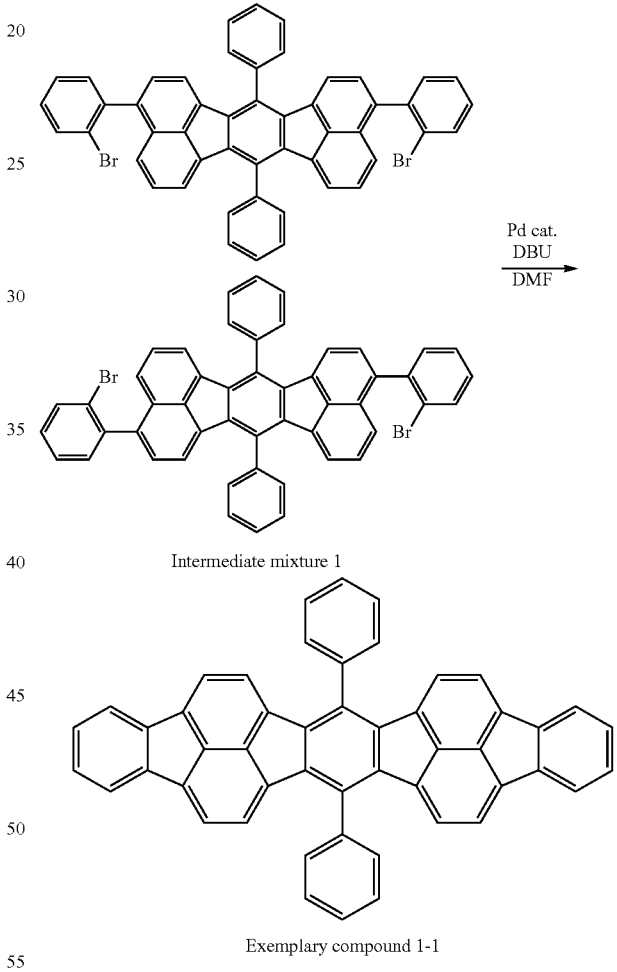

Exemplary compound 1-1

The following compounds were fed into a reaction vessel in a nitrogen atmosphere:
(1) Intermediate mixture 1: 0.385 g (0.488 mmol)
(2) 1,8-Diazabicyclo[5.4.0]-7-undecene (DBU): 1.49 g (9.76 mmol)
(3) $Pd(PPh_3)_2Cl_2$: 0.137 g (0.195 mmol)
(4) DMF (4 mL)

This reaction solution was stirred for three hours while being heated in a silicone oil bath heated to 170° C. The reaction solution was then cooled to room temperature, and water and methanol were added to precipitate a solid crude product. The crude product was then filtered, was washed with methanol, and was purified by silica gel column chromatography (developing solvent: chloroform/heptane, 1:2) to yield 0.251 g (yield: 82%) of exemplary compound 1-1. The solid was dried in a vacuum at 120° C. and was purified by sublimation at 400° C. No decomposition product was recognized after the sublimation purification.

By matrix assisted laser desorption/ionization-time of flight mass spectrometry (MALDI-TOFMS), the M⁺ of the compound, namely, 626.2, was recognized.

In addition, the structure of the compound was determined by proton nuclear magnetic resonance ($^1$H-NMR) spectroscopy:

$^1$H-NMR (CDCl$_3$, 500 MHz) δ (ppm): 7.66 (10H, m), 7.48 (4H, m), 7.23 (4H, d), 7.11 (4H, dd), 6.37 (4H, d)

Example 2

An organic light-emitting device including an anode, a hole injection layer, a hole transport layer, a light-emitting layer, a hole blocking layer, an electron transport layer, an electron injection layer, and a cathode stacked on a substrate in the above order was produced by the method described below.

An anode was formed on a glass substrate by depositing ITO by sputtering. The anode had a thickness of 120 nm. The substrate on which the anode was formed was subjected to ultrasonic cleaning with acetone and then isopropyl alcohol (IPA). The substrate was then cleaned with pure water and was dried. The substrate was further subjected to UV/ozone cleaning. The substrate thus treated was used as a transparent conductive support substrate.

Next, films were formed by vacuum deposition in the order shown below. The degree of vacuum during the deposition was 1.0×10⁻⁴ Pa.

A hole injection layer was formed on the ITO film on the substrate by depositing exemplary compound 1-1. That is, the hole injection layer on the anode was formed of exemplary compound 1-1. The thickness of the hole injection layer was 5 nm, and the deposition rate was 0.1 to 0.2 nm/sec.

A hole transport layer was then formed on the hole injection layer by depositing 4,4'-bis[(1-naphthyl)phenylamino]-1,1'-biphenyl (NPD). The thickness of the hole transport layer was 40 nm, the degree of vacuum during the deposition was 1.0×10⁻⁴ Pa, and the deposition rate was 0.1 to 0.2 nm/sec.

A light-emitting layer was then formed on the hole transport layer by codepositing compound A and compound B shown below. The deposition rate was 0.1 to 0.2 nm/sec, the weight mixing ratio of compound A to compound B in the light-emitting layer was adjusted to 85:15, and the thickness of the light-emitting layer was 30 nm.

A hole blocking layer was then formed on the light-emitting layer by depositing compound C shown below. The thickness of the hole blocking layer was 10 nm, and the deposition rate was 0.1 to 0.2 nm/sec.

Compound A

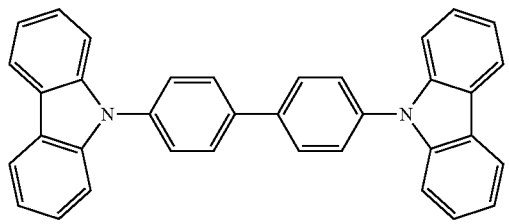

Compound B

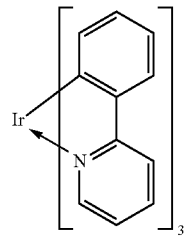

Compound C

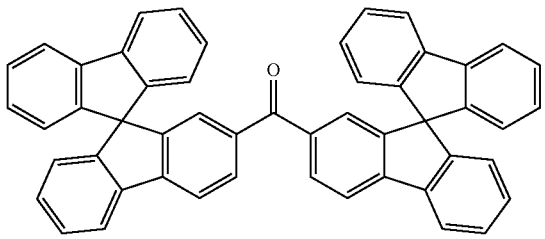

An electron transport layer was then formed on the hole blocking layer by depositing 2,9-bis[2-(9,9-dimethylfluorenyl)]-1,10-phenanthroline. The thickness of the electron transport layer was 30 nm, and the deposition rate was 0.1 to 0.2 nm/sec.

An electron injection layer was then formed on the electron transport layer by depositing lithium fluoride (LiF). The thickness of the electron injection layer was 0.5 nm, and the deposition rate was 0.01 nm/sec.

A cathode was then formed on the electron injection layer by depositing aluminum. The thickness of the cathode was 100 nm, and the deposition rate was 0.5 to 1.0 nm/sec.

Finally, the substrate was covered with a protective glass sheet and was sealed with an acrylic adhesive in a dried air atmosphere to prevent deterioration of the organic light-emitting device due to adsorption of moisture. Thus, an organic light-emitting device was produced.

The resulting organic light-emitting device was evaluated for characteristics. Specifically, the current-voltage characteristics of the device were measured using the 4140B pA meter available from Hewlett-Packard Company, and the luminous intensity of the device was measured using BM7 available from Topcon Corporation. When a voltage was applied such that the ITO electrode was positive and the aluminum electrode was negative, excellent green fluorescence was observed at 1,000 cd/m² with a voltage of 3.9 V and a luminous efficiency of 60 cd/A.

Example 3

An organic light-emitting device was produced in the same manner as in Example 2 except that the hole injection layer was formed by codepositing exemplary compound 1-1 and NPD at a weight mixing ratio of 50:50. The thickness of the hole injection layer was 5 nm.

In the evaluation of the resulting organic light-emitting device, excellent green fluorescence was observed at 1,000 cd/m² with a voltage of 4.0 V and a luminous efficiency of 60 cd/A.

Comparative Example 1

An organic light-emitting device was produced in the same manner as in Example 2 except that no hole injection layer was formed.

In the evaluation of the resulting organic light-emitting device, fluorescence was observed at 1,000 cd/m² with a voltage of 4.3 V and a luminous efficiency of 59 cd/A. This demonstrates that a device including a hole injection layer containing a fused polycyclic compound according to an embodiment of the present invention, as in Examples 2 and 3, can be driven at a lower voltage than a device including no hole injection layer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-160590 filed Jul. 15, 2010, which is hereby incorporated by reference herein in its entirety.

What is claimed is:

1. An organic light-emitting device comprising:
an anode;
a cathode;
a light-emitting layer disposed between the anode and the cathode; and
an organic layer disposed between the anode and the light-emitting layer, the organic layer comprising a fused polycyclic compound represented by general formula (1):

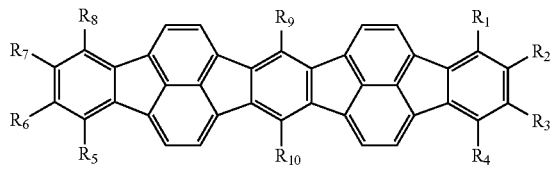

(1)

wherein $R_1$ to $R_8$ are each a hydrogen atom, a halogen atom, a cyano group, a substituted or unsubstituted alkyl group, a substituted or unsubstituted aryl group, or a substituted or unsubstituted polycyclic group and are each the same or different, and wherein $R_9$ and $R_{10}$ are substituted or unsubstituted aryl groups that are the same or different, and wherein the fused polycyclic compound does not emit fluorescent light in the visible region.

2. The organic light-emitting device according to claim 1, wherein the organic layer comprising the fused polycyclic compound is in contact with the anode.

3. The organic light-emitting device according to claim 1, wherein the organic layer comprising the fused polycyclic compound is a hole transport layer.

4. An image display comprising:
a plurality of pixels, each including the organic light-emitting device according to claim 1; and
a unit configured to supply an electrical signal to the organic light-emitting devices.

5. The organic light-emitting device according to claim 1, wherein the light-emitting layer comprises an organometallic complex.

6. The organic light-emitting device according to claim 5, wherein the organic layer comprising the fused polycyclic compound is in contact with the anode.

7. The organic light-emitting device according to claim 5, wherein the organic layer comprising the fused polycyclic compound is a hole transport layer.

8. An image display comprising:
a plurality of pixels, each including the organic light-emitting device according to claim 5; and
a unit configured to supply an electrical signal to the organic light-emitting devices.

9. The organic light-emitting device according to claim 3, wherein the hole transport layer includes at least one of triarylamines, phenylenediamines, stilbenes, phthalocyanines, porphyrins, polyvinylcarbazole, and polythiophene.

10. A device comprising:
the organic light-emitting device according to claim 5; and
a color filter.

11. A lighting device comprising the organic light-emitting device according to claim 5.

12. A printer comprising the organic light-emitting device according to claim 5.

* * * * *